(12) United States Patent
Kawanishi

(10) Patent No.: US 8,940,624 B2
(45) Date of Patent: Jan. 27, 2015

(54) METHOD FOR PRODUCING P-TYPE NITRIDE SEMICONDUCTOR LAYER

(71) Applicant: Seoul Semiconductor Co., Ltd., Ansan-si (KR)

(72) Inventor: Hideo Kawanishi, Tokyo (JP)

(73) Assignee: Seoul Semiconductor Co., Ltd., Seoul (KR)

( * ) Notice: Subject to any disclaimer, the term of this patent is extended or adjusted under 35 U.S.C. 154(b) by 0 days.

(21) Appl. No.: 13/865,574

(22) Filed: Apr. 18, 2013

(65) Prior Publication Data

US 2014/0147995 A1    May 29, 2014

(30) Foreign Application Priority Data

Apr. 19, 2012  (JP) ................. 2012-096090

(51) Int. Cl.
  *H01L 21/20*   (2006.01)
  *H01L 21/02*   (2006.01)
(52) U.S. Cl.
  CPC ...... *H01L 21/02631* (2013.01); *H01L 21/0254* (2013.01)
  USPC ............... 438/479; 438/40; 438/45; 438/47; 438/93; 438/478
(58) Field of Classification Search
  None
  See application file for complete search history.

(56) References Cited

U.S. PATENT DOCUMENTS 5,679,965 A * 10/1997 Schetzina ............ 257/103

FOREIGN PATENT DOCUMENTS

| JP | 08-008182 | 1/1996 |
|---|---|---|
| JP | 08-288577 | 11/1996 |
| JP | 2001-274457 | 10/2001 |
| JP | 2005-039197 | 2/2005 |
| JP | 2006-019764 | 1/2006 |

(Continued)

OTHER PUBLICATIONS

N. Sawaki, et al., "Acceptor Level due to Carbon in a (1-101) AlGaN", AIP Conf. Proc., Apr. 10, 2007, vol. 893, pp. 281-282.

(Continued)

*Primary Examiner* — Kyoung Lee
(74) *Attorney, Agent, or Firm* — H.C. Park & Associates, PLC

(57) ABSTRACT

A method of manufacturing a p type nitride semiconductor layer doped with carbon in a highly reproducible manner with an increased productivity is provided. The method includes supplying an III-group material gas for a predetermined time period $T_1$, supplying a V-group material gas containing a carbon source for a predetermined time period $T_2$ when a predetermined time period $t_1$ ($t_1+T_2>T_1$) elapses after the supply of the III-group material gas begins, repeating the step of supplying the III-group material gas and the step of supplying the V-group material gas when a predetermined time period $t_2$ ($t_1+T_2-t_2>T_1$) elapses after the supply of the V-group material gas begins, and thus forming an $Al_xGa_{1-x}N$ semiconductor layer ($0<x\leq1$) at a growth temperature of 1190° C.~1370° C. or a growth temperature at which a substrate temperature is 1070° C.~1250° C. using a chemical vapor deposition method or a vacuum evaporation method. Nitrogen sites within the semiconductor layer are doped with carbon.

6 Claims, 8 Drawing Sheets

(56) References Cited

FOREIGN PATENT DOCUMENTS

| JP | 2006-066641 | 3/2006 |
|---|---|---|
| JP | 2006-128726 | 5/2006 |
| JP | 2006-128727 | 5/2006 |
| JP | 2006-332383 | 12/2006 |
| JP | 2007-035846 | 2/2007 |
| JP | 2007-095744 | 4/2007 |
| JP | 2007-095745 | 4/2007 |
| JP | 2007-165405 | 6/2007 |
| JP | 2008-511969 | 4/2008 |
| JP | 2011-023541 | 2/2011 |

OTHER PUBLICATIONS

Yanqin, et al., "Deep Levels in high resistivity GaN detected by thermaly stimulated luminescence and first principles calculation", Journal of Physics D. Applied Physic, vol. 42 No. 15, Aug. 7, 2009.

C. H. Seager, et al., "Role of Carbon in GaN", American Institute of Physics, J. Appl. Phys. 92, No. 11, 6553 (2002), pp. 6553-6560.

J. L. Lyons, et al., "Carbon impurities and the yellow luminescence in GaN", Appl. Phys. Lett. 97, 152108 (2010), pp. 152108-1-152108-3.

S. Fischer, et al., "On p-type doping in GaN-acceptor binding energies", Appl. Phys. Lett, vol. 67, No. 9, Aug. 28, 1995, pp. 1298-1300.

Sung Hwan Cho, et al., "Photoluminescence of Undoped GaN Grown on c-Plane A1203 by electron Cycloton Resonance Molecular Beam Epitaxy", Jpn. J. Appl. Phys. vol. 34 (1995), pp. L1575-L1578 Part 2, No. 12A, Dec. 1, 1995.

P. Bogustawski, et al., "Amphoteric properties of substitutional carbon impurity I GaN and AlN ", Appl. Phys. Lett., vol. 69, No. 2, Jul. 8, 1996, pp. 233-235.

K. Tateno, et al, "Carbon doping and etching effects of CBr 4 during metalorganic chemical vapor deposition of GaAs and AlAs", Journal of Crystal Growth 172 (1997) 5-12.

K. Tateno, et al., "Carbon and silicon doping In GaAs and AlAs grown on (3 1 1)-oriented GaAs substrates by metalorganic chemical vapor deposition", Journal of Crystal Growth 181 (1997) 33-40.

Yanning Gong, et al., "Quantitative study of carbon doping of GaAs grown by metalorganic vapor-phase epitaxy", Journal of Crystal Growth 209 (2000) pp. 43-49.

Tetsuya Yamamoto, et al., "Effects of oxygen Incorporation in p-type AlN crystals doped with carbon species", Physica B 273-274 (1999) 113-115.

H. Katayama-Yoshida, et al., "Codoping method for the fabrication of low-resistivity wide band-gap semiconductors in p-type, GaN, p-type AlN and n-type diamond: prediction versus experiment", Journal of Physics: Condensed Matter 13 (2001), pp. 8901-8914.

H. Katayama-Yoshida, et al., "Ab nitto materials design for transparent-conducting-oxide-based-new-functional materials", Appl. Phys. A 89, (2007), pp. 19-27.

N. Sawaki, et al., "A local vibration mode in a carbon doped (1-101)AlGaN", Proc of SPIE, vol. 8262, (2012) pp. 82620DD-1-82620D-7.

T. Hirosaka, et al., "Optical and electrical properties of (1-101) GaN grown on a 7 off-axis (001)Sii Substrate", Applied Physics Letters, vol. 84, No. 23, Jun. 7, 2004, pp. 4717-4719.

Rob Armitage, et al., "Electrical and Optical Properties of Carbon Doped GaN Grown by MBE on MOCVD GaN Templates Using a CCl4 Dopant Source", Lawrence Berkeley National Laboratory, (2002) Apr. 15, 2002.

D. J. As, et al., "Carbon doping of cubic GaN under gallum-rich growth conditions", Phys. stat. sol. (c) 0, No. 7, 2537-2540 (2003).

D. J. As, et al., "Carbon Doping of non-polar cubic GaN by CBr4", Journal of Crystal Growth, 311 (2009) 2039-2041.

D. S. Green, et al., "Carbon doping of GaN with CBr4 In radiofrequency plasma-assisted molecular bean epitaxy", Journal of Applied Physics, vol. 95, No. 12, Jun. 15, 2004, pp. 8456-8462.

W. S. Hobson, "CCl4 doping of GaN grown by metaorganic molecular beam epitaxy", Appl. Phys. Lett. 66 (15), pp. 1959-1971 (1995).

Norikatsu Kolde, et al., "Incorporation of carbon on a (1101) facet of GaN by MOVPE", Journal of Crystal Growth 284 (2005) 341-346.

Hideo Kawanishi, et al, "Carbon-doped p-type (0001) plane AlGaN [Al—6-55%) with high hole density", Phys. Status Solidi B 249, No. 3, 459-463 (2012).

Hideo Kawanishl, "Carbon-doped p-type (0001) plane AlGaN (A1—0.06 to 0.55) with high hole density", Department of Electrical Engineering, Kogakuln University, Nakano-machi 2665-1, Hachioji-shi, Tokyo 192-0015, Japan (2012).

P. Bogustawskl, et al., "Doping properties of C, SI, and Ge Impurities In GaN and AlN ", Physical Review B, vol. 56, No. 15, pp. 9496-9505, Oct. 15, 1997-1.

Yanqin Gal. et al., "Deep levels in high resistivity GaN detected by thermall stimlated luminescence and first-principles calculations", Journal of Physics D, Applied Physic, vol. 42, No. 15, Aug. 7, 2009, Abstract.

\* cited by examiner (a)

(b)

(c)

(a)

(b)

METHOD FOR PRODUCING P-TYPE NITRIDE SEMICONDUCTOR LAYER

FIELD OF THE INVENTION

The present invention is related to a method of manufacturing a p type nitride semiconductor layer doped with carbon.

DESCRIPTION OF THE RELATED ART

The control of electrical conductivity in a p type AlGaN is a very difficult problem from a technical and scientific viewpoints. Magnesium (Mg) is the only p-type dopant for GaN and AlGaN. However, the acceptor level of Mg is approximately 230 mV (experimental energy value) in GaN. The acceptor level of approximately 230 mV (experimental energy value) in GaN is deeper than that in AlGaN. As a result, the electrical conductivity of AlGaN doped with Mg (Mg-doped AlGaN) is extremely small. Therefore, AlGaN doped with Mg (Mg-doped AlGaN) cannot be applied to an optical element such as a light emitting diode (LED) or a laser diode etc.

For example, the acceptor level of magnesium (Mg) deepens with the aluminum solid composition of AlGaN doped with Mg (Mg-doped AlGaN). Consequently, the electrical activity of Mg drops to 1% or less, and then, the hole concentration in AlGaN becomes extremely small and the electrical resistivity increases. Although a large amount of Mg is added to AlGaN in order to prevent an increase in electrical resistivity, the segregation of Mg is caused and then the crystalline quality of AlGaN drops significantly when the added Mg concentration is 2×1020 cm-3 or more. Therefore, 2×1020 cm-3 or more of Mg cannot be added into nitride semiconductors. As a result, realization of LEDs, electrical power control devices, and semiconductor lasers using AlGaN doped with Mg is difficult.

In addition, when an n type layer is created on a p type layer doped with Mg, the Mg thermally diffuses from the p type layer into the n type layer along the defects, and then n type layer cannot be realized. Therefore, an npn or pnp bipolar type transistor cannot be realized by using a p type layer doped with Mg. This presents a large problem for realizing an electric power control device for an electric vehicle or hybrid vehicle.

Patent document 1 discloses the following technology for realizing stable use of carbon as a p type dopant in a nitride semiconductor. A support formed of a III-group nitride semiconductor having a main surface which has a limited angle with respect to a reference plane which intersects a reference axis extending in a c axis direction is used, and a p type nitride semiconductor layer having a carbon concentration of $2 \times 10^{16}$ cm$^{-3}$ or more is formed on the main surface of the support.
Patent Document 1: Japanese Laid Open Patent Publication 2011-23541

SUMMARY OF INVENTION

Problems to be Solved by Invention

However, when the method of using carbon disclosed in patent document 1 is used, a p type nitride semiconductor layer cannot be formed sufficiently stably.

In addition, p type conductivity has been demonstrated experimentally in a surface of an hexagonal GaN (1-101) doped with C and other outermost surfaces of GaN. However, despite the experiments and theoretical discussions made regarding carbon acceptors in GaN, p type conductivity in GaN doped with C has not been realized yet conventionally.

A purpose of the present invention, made in light of the above problems, is to provide a highly productive method of manufacturing a p type nitride semiconductor layer such as a p type nitride semiconductor layer doped with carbon in a highly reproducible manner.

DESCRIPTION OF THE PREFERRED EMBODIMENT

Summary of this invention is a structure mentioned below to achieve the above mentioned purpose. A method of manufacturing a p type nitride semiconductor layer of the present invention is comprising, supplying a III-group material gas for a predetermined time period $T_1$, supplying a V-group material gas containing a carbon source for a predetermined time period $T_2$ when a predetermined time period $t_1$ ($t_1 + T_2 > T_1$) elapses after the supply of the III-group material gas begins, repeating the step of supplying the III-group material gas and the step of supplying the V-group material gas when a predetermined time period $t_2$ ($t_1 + T_2 - t_2 > T_1$) elapses after the supply of the V-group material gas begins, and thus forming an $Al_xGa_{1-x}N$ semiconductor layer (0<x≤1) at a growth temperature of 1190° C.~1370° C. or a growth temperature at which a substrate temperature is 1070° C.~1250° C. using a chemical vapor deposition method or a vacuum evaporation method, wherein nitrogen sites are doped with carbon within the semiconductor layer.

In addition, the method of manufacturing the p type nitride semiconductor layer of the present invention, wherein a single crystal substrate is a sapphire substrate having a main surface having an offset angle in a range of +/−0.1% with respect to a (0001) C-plane in said structure.

In addition, the method of manufacturing the p type nitride semiconductor layer of the present invention, wherein the carbon source is carbon tetrabromide in said structure.

In addition, the method of manufacturing a p type nitride semiconductor layer of the present invention, wherein the V-group material contains a magnesium source in said structure.

In addition, the method of manufacturing the p type nitride semiconductor layer of this invention, wherein a content of aluminum is 5 mol %~100 mol % in said structure.

In addition, the method of manufacturing the p type nitride semiconductor layer of the present invention, wherein no overlap time period is set between the time period $T_1$ for supplying the III-group material gas and the time period $T_2$ for supplying the V-group material gas, and an interval time period between the time period $T_1$ for supplying the III-group material gas and the time period $T_2$ for supplying the V-group material gas is set to 0 seconds or more and 2 seconds or less in said structure.

Effect of Invention

In this manner, the p type nitride semiconductor layer manufactured by the method of manufacturing the p type nitride semiconductor layer of this invention is stably doped with carbon. The present invention may provide a manufacturing method of a p type nitride semiconductor layer doped with carbon with improved productivity.

According to the present invention, it is possible to realize p type layer with low resistivity even in a power device in which a large current flows. Therefore it is possible to realize a nitride electrical power control device with higher performance.

BRIEF EXPLANATION OF THE DRAWINGS

FIG. 3 (b) shows a low temperature photoluminescence (PL) spectrum obtained from C-doped AlGaN with 9% of Al solid composition;

FIG. 5 (a) shows the depth profile of an AlGaN semiconductor layer doped simultaneously with C and Mg; and FIG. 5 (b) shows the depth profile of an AlGaN semiconductor layer doped only with C;

FIG. 6 (b) shows the carbon doping characteristics for AlGaN with 55% of Al solid Al composition using CBr4 as a carbon source.

MODE FOR CARRYING OUT THE INVENTION

In the manufacturing method of the present invention, a p type nitride semiconductor layer such as a p type AlGaN semiconductor layer can be formed using chemical vapor deposition methods (CVD) such as a metal organic chemical vapor deposition method (MOCVD), a plasma enhanced chemical vapor deposition (PECVD), or a low pressure chemical vapor deposition method (LPCVD), or vacuum evaporation methods such as a molecular beam epitaxy method (MBE).

A embodiment of a method of manufacturing a p type nitride semiconductor layer of the present invention will be explained using a MOCVD method as an example while referring to the diagrams.

First, a cleaned single crystal substrate 1 is prepared and then set within a MOVPE system (FIG. 1(a)). The MOVPE system used here can be a known system. A single crystal substrate having a main surface with an offset angle in a range of +/−0.1% with respect to a (0001) C-plane is used as the substrate 1. A sapphire substrate is a most preferred substrate as the single crystal substrate.

Figure 1:
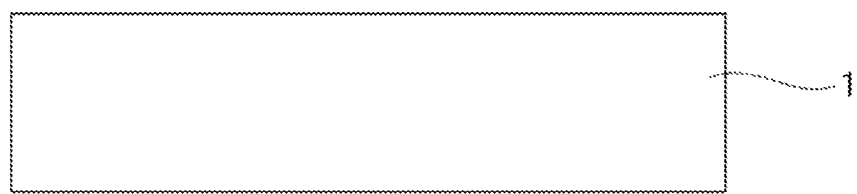
FIG. 1 is a step diagram which schematically shows steps for a crystal growth of a p type AlGaN semiconductor layer on a single crystal substrate according to one embodiment of the present invention.
Figure 1:
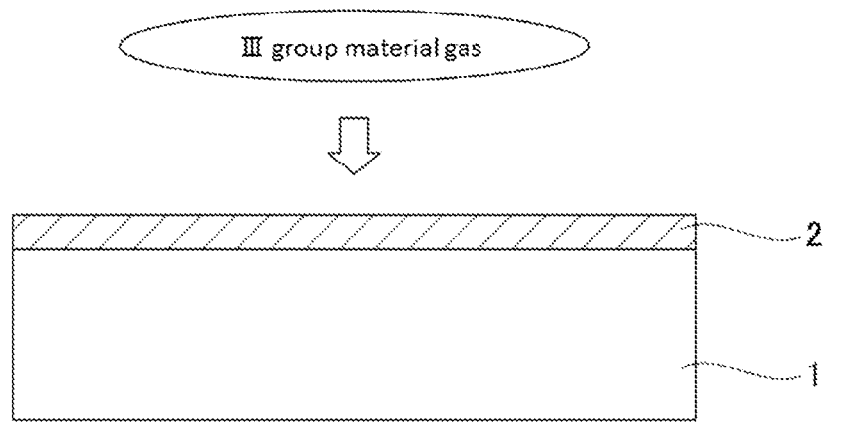
Figure 1:
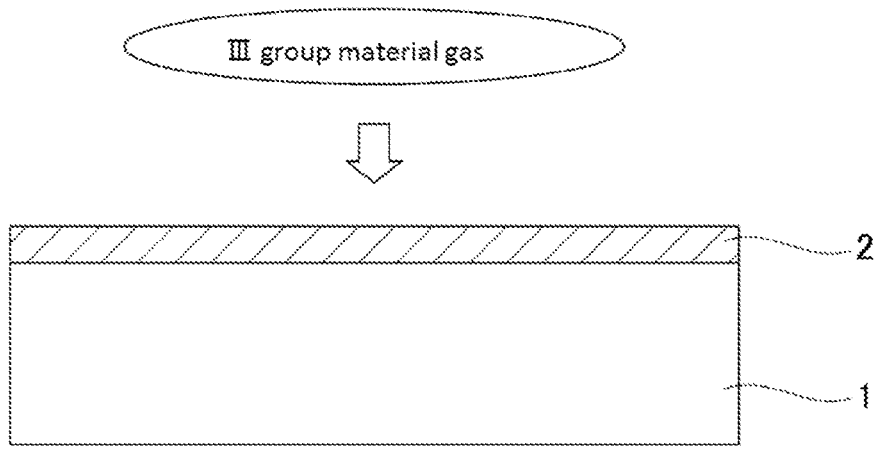

Next, a III-group material gas is supplied to the interior of the MOVPE system for a predetermined time period $T_1$ (FIG. 1 (b)). When a predetermined time period $t_1$ elapses after the supply of the III-group material gas begins, a V-group material gas containing a carbon source is supplied for a predetermined time period $T_2$ ($t_1+T_2>T_1$) (FIG. 1 (c)). When a predetermined time period $t_2$ ($t_1+T_2-t_2>T_1$) elapses after the supply of the V-group material gas begins, the step of supplying the III-group material gas and the step of supplying the V-group material gas are repeated. A known gas such as hydrogen or the like can be used as the carrier gas of the III-group material gas and the V-group material gas.

The step of supplying the III-group material gas and the step of supplying the V-group material gas are preferred to be performed until the content of aluminum in an $Al_xGa_{1-x}N$ semiconductor layer (0<x≤1) becomes 5 mol %~100 mol % and the maximum net ionized acceptor density (NIAD= $(N_A^- - N_D^+)$ becomes a value in a range of $3~7 \times 10^{18}$ cm$^{-3}$ according to a capacitance-voltage measurement.

Carbon tetrabromide ($CBr_4$) is preferably used as the carbon source to be mixed with the V-group material gas. It is not preferred to use acethylene as a carbon source because it has high reactivity and is dangerous. It is not preferred to use carbon tetrachloride as a carbon source because it has etching effects, and when the flow rate thereof is too high, the crystal growth rate decreases significantly and a semiconductor layer is no longer formed. Carbon tetrabromide also has etching effects but is preferably used as a carbon source because bromine has a greater atom number than chlorine, and therefore has a slightly softer chemical reactivity although being a halide like carbon tetrachloride.

In the case where ammonia is used as a component of a V-group material gas, the dissociation rate of nitrogen atoms from ammonia gas molecules is closely related to the growth temperature of a p type AlGaN semiconductor layer. Therefore, it is preferred that a III-group material gas and a V-group material gas are supplied at a growth temperature of a range of 1190° C.~1370° C. or a growth temperature at which the substrate temperature is in a range of 1070° C.~1250° C.

In addition, the most suitable growth temperature of the p type AlGaN semiconductor layer to be formed changes depending on the mol % of aluminum contained in the p type AlGaN semiconductor layer. For example, in the case of AlGaN having a content of aluminum from a few % to 25 mol %, a most suitable growth temperature is 1190° C.~1230° C. However, in the case where the mol % of aluminum contained in the AlGaN to be formed is increased, it is necessary to form the layer at a high temperature from the viewpoint of crystal quality and doping characteristics. Therefore, the growth temperature in this case is preferably between 1190° C.~1370° C.

It is preferred that a magnesium source be mixed with the components of the V-group material gas and the amount is about 1/100 times~100 times the partial pressure of the gas comprised from a carbon source. It is most preferable that the mixing of the magnesium source is conducted until a total NIAD of carbon and magnesium becomes a value within a range of $3~7 \times 10^{18}$ cm$^{-3}$ by the capacitance-voltage measurement. This is because the sites of the nitrogen atoms within the AlGaN crystal are doped with the carbon and magnesium atoms contained in the V-group material gas during the growth of the p type AlGaN semiconductor layer and thus it is possible to perform carbon doping stably.

A p type AlGaN semiconductor layer doped with carbon is formed by repeating the step of supplying a III-group material gas for a predetermined period of time and the step of supplying a V-group material gas for a predetermined period of time using a predetermined overlap time period or an interval time period (I1, I2) between the steps.

Figure 2:
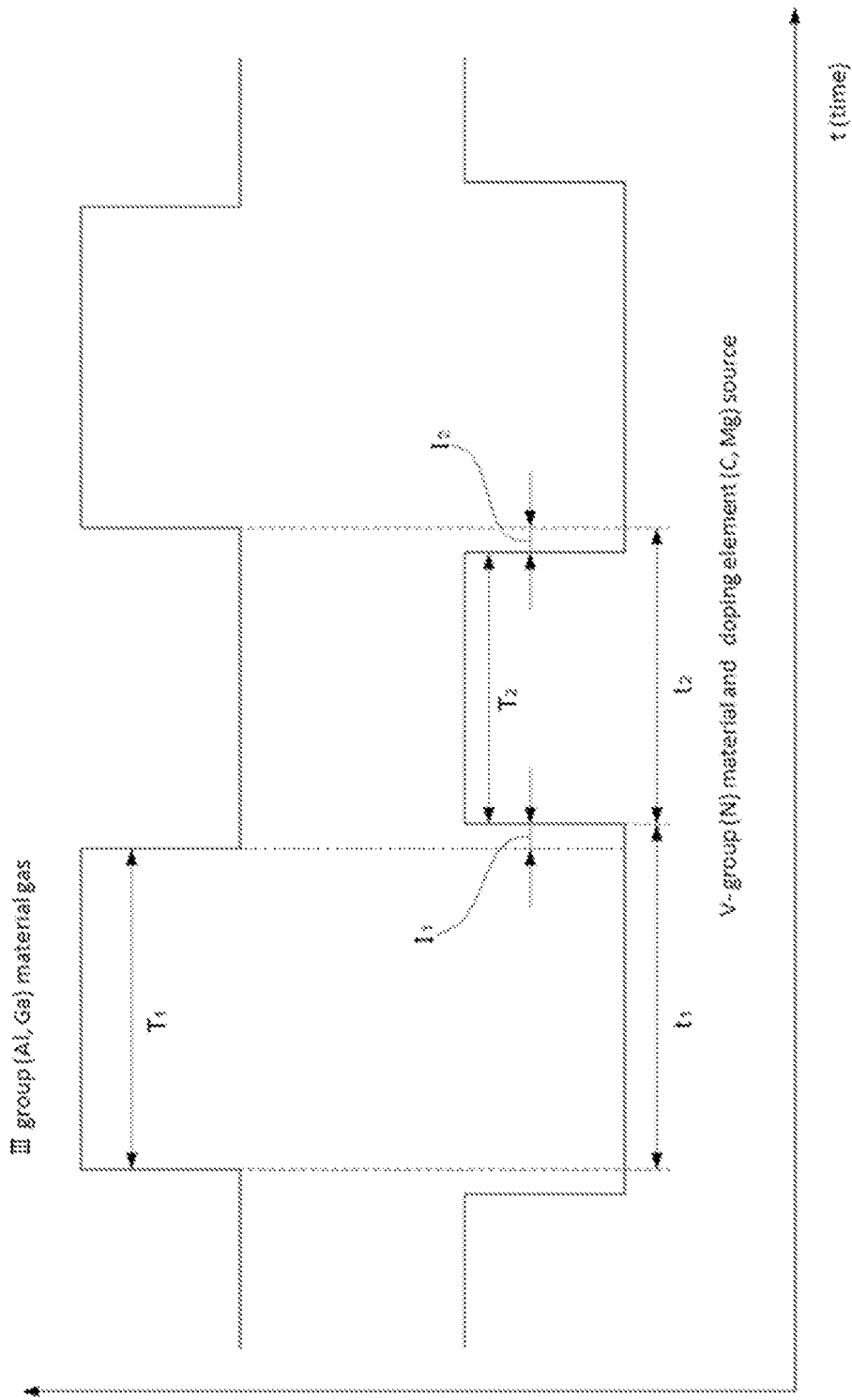
FIG. 2 is a sequence diagram showing the timing for a supply of elements for growth before and after the growth of the p type AlGaN semiconductor layer during the crystal growth of the p type AlGaN semiconductor layer on the single crystal substrate according to one embodiment of the present invention.

Here, as is shown in FIG. 2, it is preferred not to set an overlap time period between the time period T1 for supplying the III-group material gas and the time period T2 for supplying the V-group material gas, and to set an interval time period between the time period T1 for supplying the III-group material gas and the time period T2 for supplying the V-group material gas to 0 seconds or more and 2 seconds or less.

This is because it is made possible to stably dope the nitrogen atom sites within the AlGaN crystal with carbon by setting an interval time period between the time period T1 for supplying the III-group material gas and the time period T2 for supplying the V-group material gas. However, an interval time period of more than 2 seconds is not preferable because in this case, the interface of a heterostructure to the p type AlGaN crystal is damaged.

EXAMPLES

Growth of a p Type AlGaN Semiconductor Layer According to the Method of the Present Invention A GaN or AlGaN layer was grown on a (0001) plane of a sapphire substrate by a conventional low pressure metal organic-vapor phase epitaxy method (LP-MOVPE). The growth pressure and the growth temperature were set to 40 hPa and 1180° C. respectively. TMGa, TMAl, CBr4 and NH3 were used as the sources of Ga, Al, C and N. The epitaxial growth conditions were as follows:
Temperature setting during growth: 1190° C.~1370° C.
Substrate surface temperature: 1070° C.~1250° C.
Material gas pressure during growth: 40~200 hPa.
Ratio of V-group/III-group (mol ratio/partial pressure ratio): about 200~600.
Supply amount of carbon tetrabromide: $7 \times 10^{-8}$ mol/min~$1.7 \times 10^{-5}$ mol/min
Supply amount of cyclopentadienyl magnesium (Cp2Mg): $1.3 \times 10^{-7}$ mol/min~$1.6 \times 10^{-7}$ mol/min.
Supply amount of III-group material gas (trimethylgallium (TMG) and triethylaluminum (TMAl): $5 \times 10^{-5}$ mol/min.

The number of times each of the III-group material gas and the V-group material gas was supplied and the time period T1 for supplying the III-group material gas and the time period T2 for supplying the V-group material gas were appropriately adjusted so as to obtain a desired thickness of the p type AlGaN semiconductor layer under the condition where the interval time period between T1 and T2 would be 0~1 second.

The structure of the sample was as follows. A single C-doped AlGaN layer (layer thickness: 1 μm) was grown on an undoped AlGaN (layer thickness: 2~4 μm) template in order to perform a Van der Pauw geometry Hall effects measurement. By contrast, a thick n type GaN or AlGaN template (layer thickness: 2~4 μm) was grown on a high temperature undoped AlN layer (layer thickness: several nanometers).

Next, an undoped GaN active layer (layer thickness: 10~15 μm) and a C-doped AlGaN layer (layer thickness: 0.1~1.5 μm) were consecutively grown on the n type GaN or AlGaN template in order to perform a capacitance-voltage (C-V) measurement, SIMS analysis and I-V characteristics measurement. A thin Mg-doped GaN cap layer (layer thickness: 10 nm) was grown on the C-doped AlGaN layer as an ohmic contact layer in order to perform a C-V measurement and form a LED.

(Crystalline Qualities of the p Type AlGaN Semiconductor Layer Manufactured by the Method of the Present Invention)

The crystalline qualities of the C-doped AlGaN samples formed above were evaluated by an X-ray rocking curve analysis using (0002) and (10$\bar{1}$2) reflections.

Next, the results of the X-ray rocking curve analysis were calibrated by transmission electron microscope analysis data for (000) and (0002) diffraction spots and a (11$\bar{2}$0) plane with the electron beams incident along the [1-100] direction. According to the X-ray rocking curve analysis, the full width at half maximum (FWHM) for the (0002) ω-scan and the (10$\bar{1}$2) φ-scan were around 120-150 and 300-350 arcsec, respectively. This means that in the C-doped p type AlGaN layer, the density of dislocations including screw-type dislocations and mixed-type dislocations was estimated to be 2~5× $10^7$ cm$^{-3}$, and the density of the mixed-type dislocations and edge-type dislocations was estimated to be 7×$10^8$ cm$^{-3}$~2× $10^9$ cm$^{-3}$. According to the X-ray rocking curve analysis, the crystalline qualities of the C-doped AlGaN showed significant similarities to the undoped AlGaN which was grown on the C-plane of the sapphire substrate with the same growth conditions and the same layer structure.

(Optical Characteristics of the C-Doped AlGaN)

The optical characteristics of the C-doped AlGaN and the undoped AlGaN were compared with the aim of finding the carbon acceptor level in the (0001) plane of the C-doped AlGaN in addition to clarifying the effects of carbon on light emission characteristics.

Figure 3:
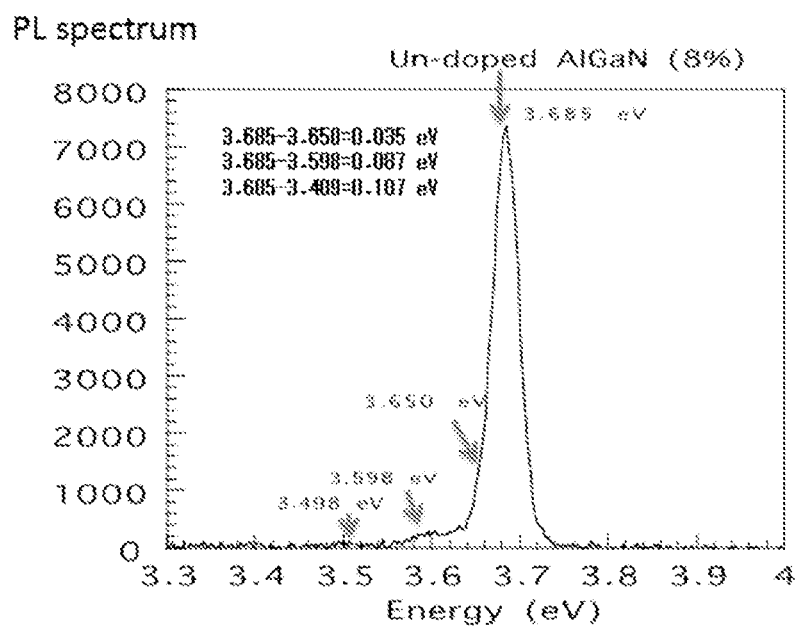
FIG. 3 (a) shows a low temperature photoluminescence (PL) spectrum obtained from undoped AlGaN with 8% of Al solid composition.
Figure 3:
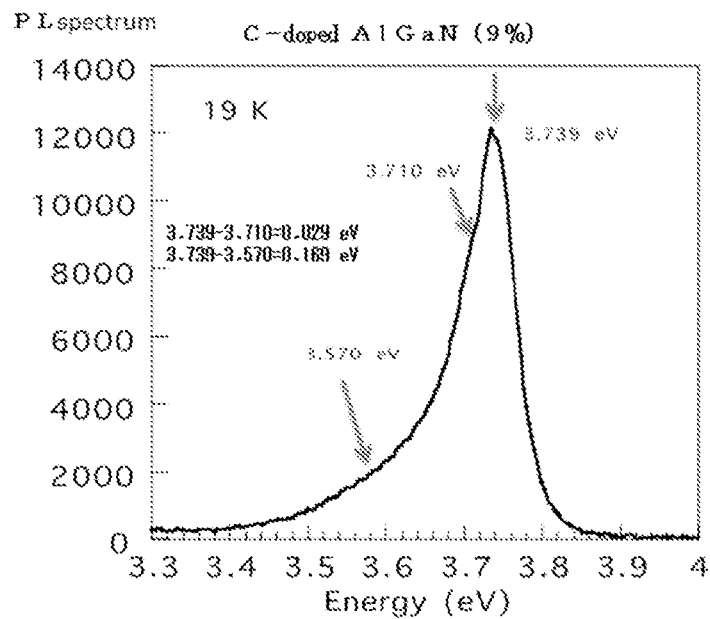

FIG. 3 (a) shows a low temperature photoluminescence (PL) spectrum obtained from undoped AlGaN in which a solid composition of aluminum (referred to below as "Al solid composition") is 8%. One, main (maximum) emission and three weak emissions were measured to be $E_m$=3.685 eV, $E_1$=3.650 eV, $E_2$=3.598 eV and $E_3$=3.498 eV respectively. FIG. 3(b) shows a low temperature PL spectrum obtained from C-doped AlGaN having 9% of Al solid composition. One main (maximum) emission, one next maximum emission (also called "sub-peak emission") and one weak emission were measured to be $E_m$=3.739 eV, $E_1$=3.710 eV, and $E_3$=3.570 eV respectively.

FIGS. 3 (a) and (b) show photoluminescence (PL) spectra obtained from an undoped AlGaN layer and a C-doped AlGaN layer having approximately 8~9% of Al solid composition at 19K (Kelvin) under weak pulsated excitation of a excimer laser at 193 nm with an optical attenuator (type ML-2100-S, METROLUX).

The main light emission, that is, the maximum peak appeared at $E_m$=3.685 eV, which is related to a band-edge emission from the undoped AlGaN as is shown in FIG. 3 (a). Compared to this, one main emission and three weak emissions were measured to be $E_m$=3.685 eV, $E_1$=3.650 eV, $E_2$=3.598 eV and $E_3$=3.498 eV respectively. The difference in photon energy calculated between the one main emission and the three weak emissions were ($E_m$–$E_1$)=35 meV, ($E_m$–$E_2$)=87 meV and ($E_m$–$E_3$)=187 meV respectively.

The inventor of the present invention observed spectral broadening in the PL emission from the C-doped AlGaN shown in FIG. 3 (b). Photon energy of each emission was measured very carefully. The emission at the maximum peak was $E_m$=3.739 eV, which is related to a band-edge emission from the C-doped AlGaN but is not related almost at all to the sample in FIG. 3 (a) with a different Al solid composition. The second maximum emission observed near the maximum peak, that is, the sub-peak emission, was $E_1$=3.710 eV. The weak emission was measured to be $E_3$=3.570 eV.

Emission intensity of the sub-peak $E_1$ and the weak emission $E_3$ depend strongly on the flow rate of $CBr_4$. Therefore, the inventor concluded that these two emissions are related to the carbon acceptors in the C-doped AlGaN.

The differences in photon energy between the maximum peak emission and the sub-peak emission and between the maximum peak emission and the weak emission were ($E_m$−$E_1$)=29 meV and ($E_m$−$E_3$)=169 meV respectively.

The inventor found it necessary to further analyze and discuss the difference in photon energy in consideration of free excitons and bounded excitons. However, $E_1$ and $E_3$ from the undoped AlGaN and $E_1$ and $E_3$ from the C-doped AlGaN were originated from the carbon acceptors in the undoped AlGaN and the C-doped AlGaN. The inventor estimated that two acceptor levels of carbon of 29-35 meV and 169-187 meV are a shallow acceptor level and a deep acceptor level respectively. The shallow acceptor level of ($E_m$−$E_1$)=29 meV was considered to play an important role for p type conduction of the C-doped AlGaN with a high hole density.

(Hall Effect Measurement)

Measurement of the Hall effects of AlGaN with 10% of Al solid composition was performed using the following simple structure.

A single C-doped AlGaN layer (layer thickness: 1 μm) was grown on an undoped AlGaN template (layer thickness: 2~4 μm) which did not include a GaN cap layer doped with magnesium (Mg-doped GaN cap layer). As a result, a p type GaN cap layer doped with Mg was not formed in GaN and AlGaN when the Al solid composition was less than 10% so that the Van der Pauw geometry Hall effects can be measured.

The inventor first attempted carbon doping into the (0001) plane of GaN; however, p type conductivity was not realized. The results of the inventor's experiments strongly suggests that a small amount of aluminum plays an important role in p type conductivity of AlGaN and that aluminum is necessary for p type conductivity of the (0001) plane of AlGaN. In the meantime, the inventor experimentally realized p type conductivity in C-doped AlGaN. The (0001) plane of the undoped AlGaN layers were all n type, and the background free electron density was in a range of $3\sim9\times10^{15}$ cm$^{-3}$. The typical hole mobility of these samples was in a range of 20~80 cm$^2$/V-s at room temperature.

Figure 4:
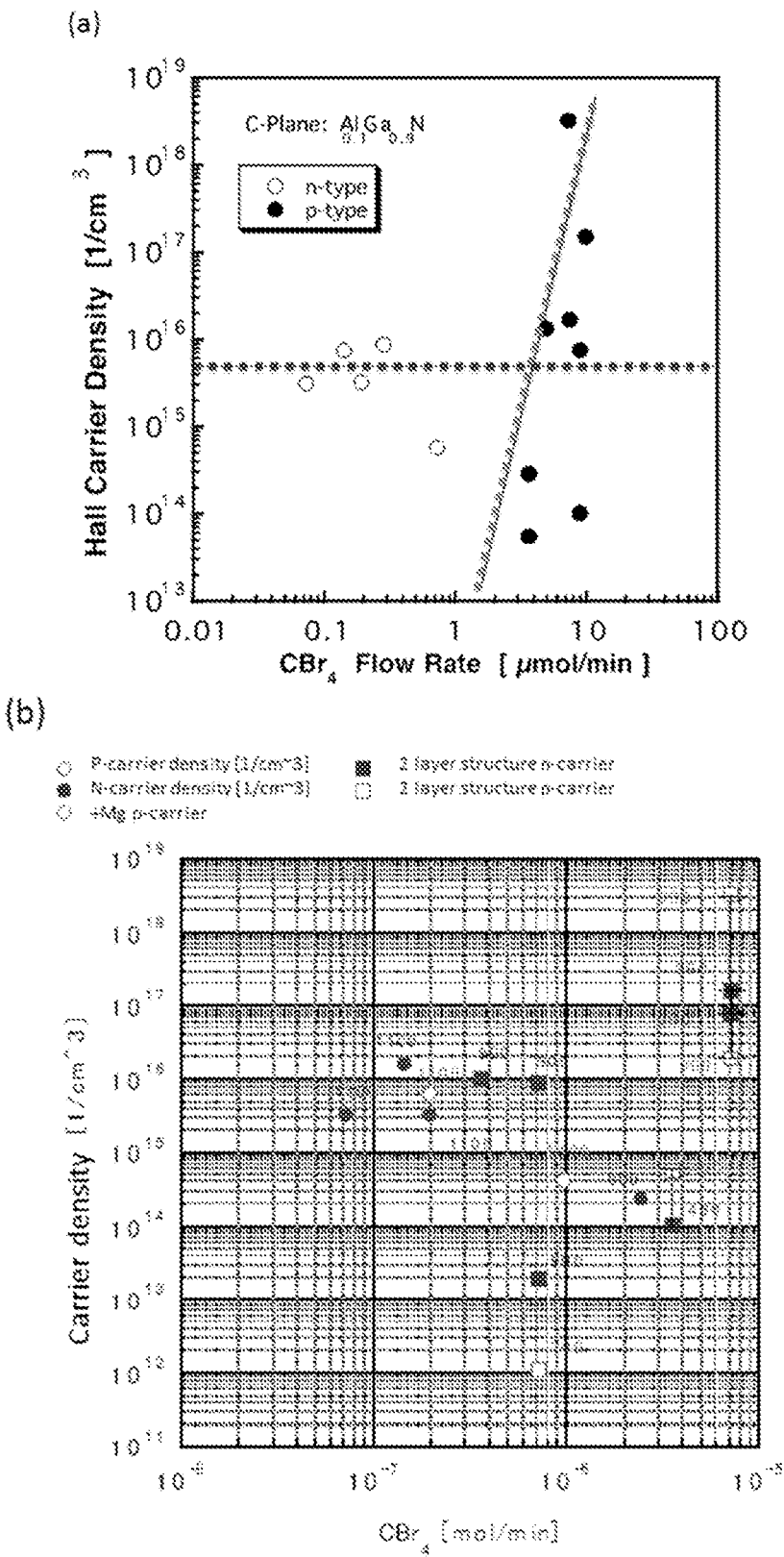
FIGS. 4 (a) and (b) are graphs which show the dependency of free electron density on the flow rate of CBr4 regarding Al0.1Ga0.9N doped with carbon.

FIGS. 4 (a) and (b) are graphs which show the dependence of free electron density on the flow rate of $CBr_4$ regarding $Al_{0.1}Ga_{0.9}N$ doped with carbon and are obtained from a measurement of the Van der Pauw geometry Hall effects. The white circle data and black circle data show n type conductivity (free electron density) and p type conductivity (free hole density) of $Al_{0.1}Ga_{0.9}N$, respectively.

The inventor observed n type electrical conductivity of C-doped AlGaN with a free electron density in a range of n≈$3\times10^{14}$ cm$^{-3}$ to $9\times10^{15}$ cm$^{-3}$ when the flow rate of $CBr_4$ was 0.06~0.3 μmol/min.

The free electron density decreased to n≈$5\times10^{14}$ cm$^{-3}$ when the flow rate of $CBr_4$ was 0.07 μmol/min When the flow rate of $CBr_4$ was about 3 μmol/min or more, the electrical conductivity changed from n type to p type, and the free hole density increased rapidly from p≈$4\times10^{13}$ cm$^{-3}$ to $3\times10^{18}$ cm$^{-3}$ with an increase in the flow rate of $CBr_4$. The maximum free hole density was p≈$3.2\times10^{18}$ cm$^{-3}$, which was obtained when the flow rate of $CBr_4$ was 5 μmol/min, and this value corresponds to a sheet carrier density of $7.5\times10^{14}$ cm$^{-2}$.

In this case, the electrical conductivity, sheet resistivity and electron mobility at room temperature of a 2.3 μm-thick C-doped AlGaN single layer were 20 ohm-cm, $8.6\times10^4$ ohm/cm$^2$ and 0.4 cm$^2$/V-s. The hole mobility in a p type region of the C-doped AlGaN varied from 0.4 to 20 cm$^2$/V-s at room temperature.

(C-V Measurement)

A C-V measurement was performed for C-doped AlGaN using nano-metrics C-V system (type ECV-Pro) at room temperature in order to measure NIAD, which is defined as NIAD=($N_A^-$−$N_D^+$) (where $N_A^-$ and $N_D^+$ are ionized acceptors and donor densities respectively). A KOH density of an electrolyte used was 0.001=0.005 mol %, and far ultraviolet light was obtained from a mercury-xenon lamp with a 185~2000 nm wavelength light source. The atom density of each of acceptors $N_A$ and donors $N_D^+$ was independently measured by a SIMS analysis. The C-V measurement can clarify the characteristics of p type conductivity of C-doped AlGaN.

Figure 5:
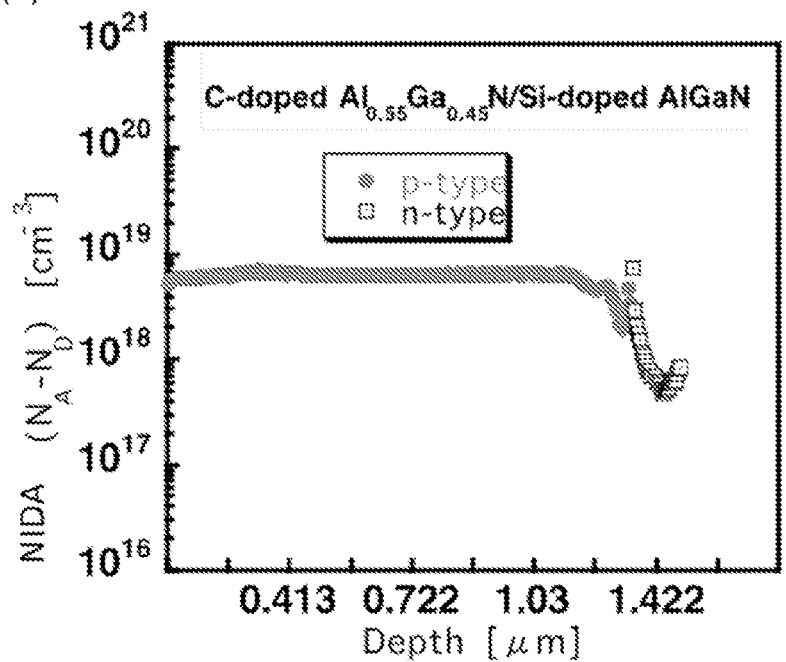
FIGS. 5 (a) and (b) are graphs each showing a depth profile of NIAD of C-doped AlGaN with 55% of Al solid composition.
Figure 5:
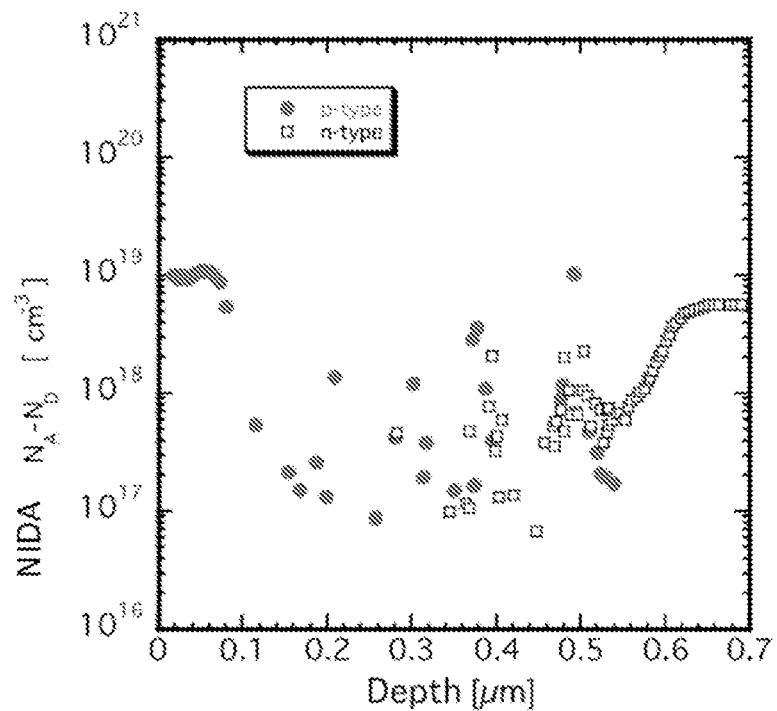

FIG. 5 (a) shows a depth profile of NIAD obtained from a C-V measurement of a sample structure of Mg-doped GaN (layer thickness: 0.08 μm)/C-doped AlGaN (aluminum mol concentration: 55%, layer thickness: 1.0 μm)/Si-doped AlGaN (x=0.55 (aluminum mol concentration: 55%), layer thickness: 2~4 μm).

The AlGaN semiconductor layer in FIG. 5 (a) was formed by simultaneous doping with carbon (C) and magnesium (Mg). The AlGaN semiconductor layer in FIG. 5 (b) was formed by doping only with C. That is, FIG. 5 (b) shows a NIAD depth profile obtained by a C-V measurement of a sample structure of GaN (layer thickness: 0.08 μm)/C-doped AlGaN (aluminum mol concentration: 55%, layer thickness: 1.0 μm)/Si-doped AlGaN (x=0.55 (aluminum mol concentration: 55%), layer thickness: 2~4 μm). As can be understood by a comparison of FIG. 5 (a) and FIG. 5 (b), Mg-doped p type GaN decreases the effects of "surface states" in a C-V measurement sample with a high carbon content and a C-V measurement sample with a low carbon content, and therefore is important for realizing a reliable and stable C-V measurement.

The electrical conductivity related to a C-doped AlGaN semiconductor layer with Al=0.55 was a p type, and the NIAD thereof remained $6\sim7\times10^{18}$ cm$^{-3}$ at a depth of 0.18 μm to 1.2 μm as is shown in FIG. 5 (a). The NIAD of the Mg-doped AlGaN was slightly lower at $5\times10^{18}$ cm$^{-3}$. By contrast, as is shown in FIG. 5 (b), the AlGaN semiconductor layer doped with only carbon is in an unstable state where the NIAD thereof varies between about $1\times10^{17}$ cm$^{-3}$ and about $2\times10^{18}$ cm$^{-3}$, and the p type and the n type acceptors are present in a mixed state, at a depth of approximately 0.9 μm to 0.54 μm.

Figure 6:
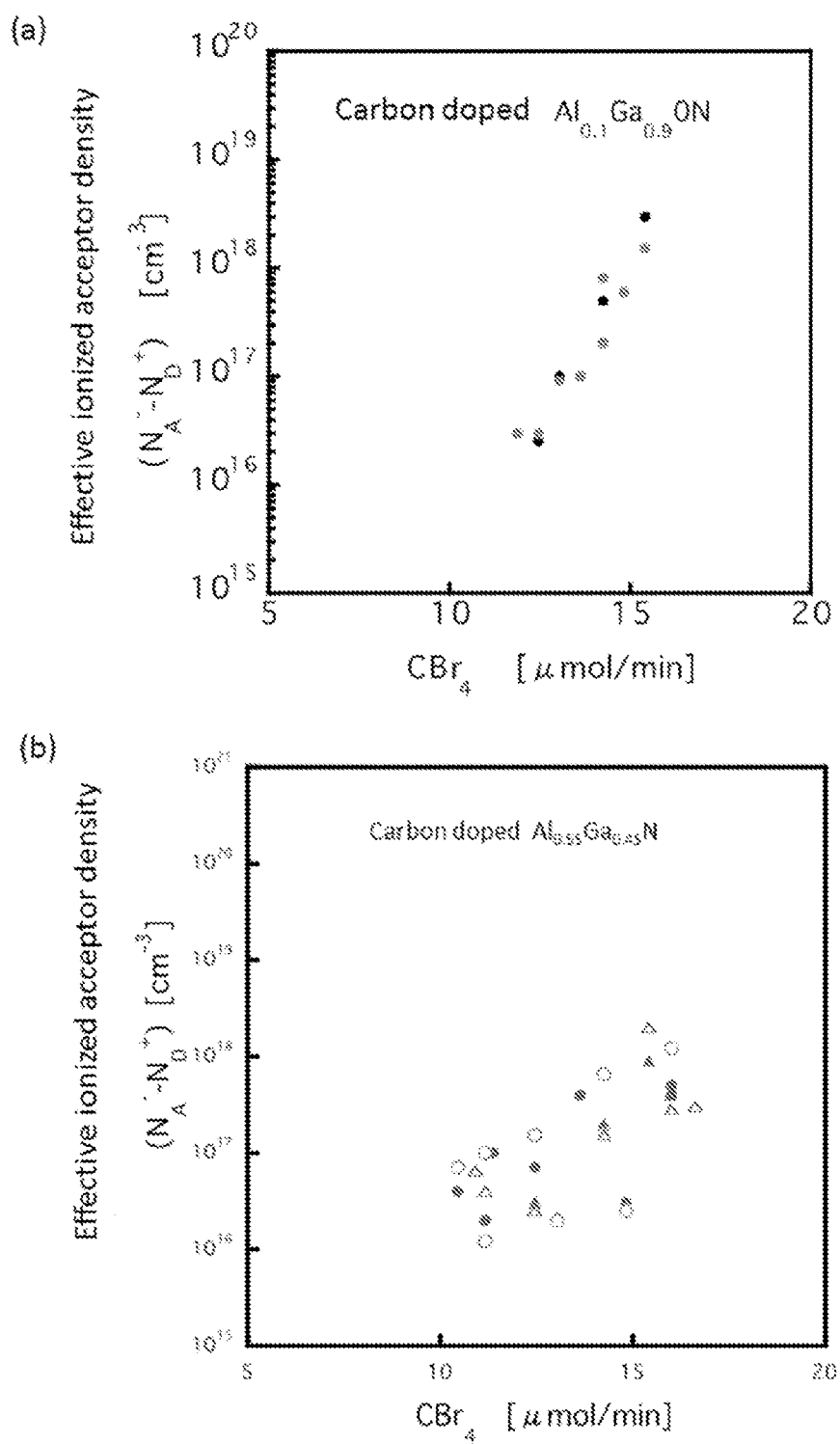
FIG. 6 (a) shows the carbon doping characteristics for AlGaN with 10% of Al solid composition using CBr4 as a carbon source.

FIGS. 6 (a) and (b) are graphs summarizing the C doping characteristics for AlGaN with 10% and 55% of Al solid composition respectively. As is shown in FIGS. 6 (a) and (b), it is possible to easily control the NIAD between $3\times10^{16}$ cm$^{-3}$ and $3\times10^{16}$ cm$^{-3}$ by changing the flow rate of $CBr_4$.

The maximum NIAD was $(6\sim7)\times10^{18}$ cm$^{-3}$, which was obtained for AlGaN with 55% of Al solid composition, as is shown in FIG. 5 (a). However, the flow rate of $CBr_4$ at which it was possible to obtain the same NIAD ($1\times10^{18}$ cm$^{-3}$ for example) was different for AlGaN with 10% of aluminum solid composition and AlGaN with 55% of aluminum solid composition. That is, in the experiments by the inventor, AlGaN with a smaller Al solid composition requires a higher $CBr_4$ flow rate in order to obtain the same NIAD.

This result is estimated to reflect the fact that p type conductivity is not realized in C-doped GaN but is realized in C-doped AlGaN. Actually, according to the experiment results of C-doping in AlGaN, for example, the same NIAD of $1\times10^{18}$ cm$^{-3}$ was obtained at the lowest flow rate of $CBr_4$ in AlGaN with about 20% of aluminum solid composition. This result also reflects the relationship between carbon and aluminum atoms in AlGaN.

Figure 7:
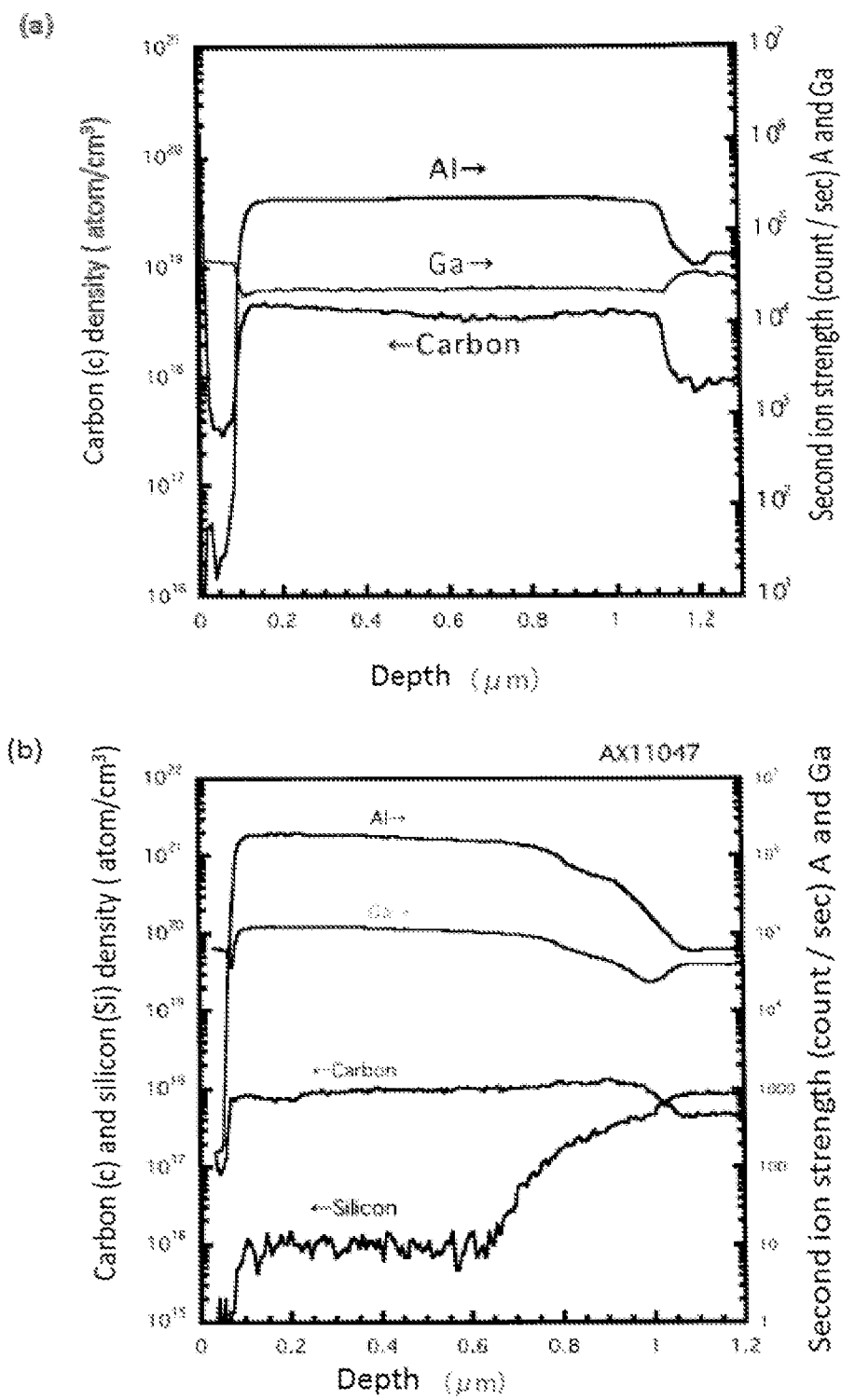
FIGS. 7 (a) and (b) show SIMS analysis results on an LED sample of a double heterostructure of Mg-doped GaN (layer thickness: 0.08 μm)/C-doped AlGaN (layer thickness: 0.1 μm)/undoped GaN (layer thickness: 10 nm)/Si-doped AlGaN (layer thickness: 3~4 μm)

Further important information related to carbon doping was obtained by a SIMS analysis. FIGS. 7 (a) and (b) show the results of a SIMS analysis on a double heterostructure of Mg-doped GaN (layer thickness: 0.08 μm)/C-doped AlGaN (aluminum mol concentration=27%, layer thickness: 0.11 μm)/undoped GaN (layer thickness: 15 nm)/Si-doped AlGaN (aluminum mol concentration=10%; layer thickness: 3 μm). The Mg concentration of a cap GaN layer was measured to be $5\times10^{19}$ cm$^{-3}$ from another SIMS analysis. The secondary ion intensities of aluminum and gallium are shown for reference.

Important information related to carbon doping was obtained by a SIMS analysis of the level of carbon concentration in a C-doped AlGaN layer. FIGS. 7 (a) and (b) show the SIMS analysis results of samples produced with different doping amounts of carbon to a AlGaN layer. The doping amounts of carbon was changed by changing the flow rate of CBr$_4$, which was a carbon supply source. As can be seen in FIGS. 7 (a) and (b), by changing the flow rate of CBr$_4$, the carbon concentration changed to $(4\sim5)\times10^{18}$ cm$^{-3}$ and $(0.9\sim1)\times10^{18}$ cm$^{-3}$. It is understood that the amount of carbon doping can be controlled by changing the flow rate of CBr$_4$. In the experiments by the inventor, it is possible to control the concentration of the carbon which is doped to $3\times10^{18}$ cm$^{-3}$ at the maximum. Before the SIMS analysis was started, the system was carefully adjusted so that analysis of the carbon could be carried out by a standard method using an AlGaN sample injected with carbon ions. The AlGaN sample had the same Al solid composition as the sample used in the SIMS analysis, and the AlGaN sample for ion injection was grown under the same growth conditions.

(Electrical Activity of Carbon Acceptors in AlGaN)

In the sample used to obtain results shown in FIGS. 7 (a) and (b), the NIAD of carbon acceptors in p type AlGaN (Al=27%) was $5\times10^{18}$ cm$^{-3}$. As a result, the electrical activity of the carbon acceptors in this AlGaN sample was estimated to be approximately 68% using the carbon concentration level and NIAD measured by the SIMS analysis described above.

Figure 8:
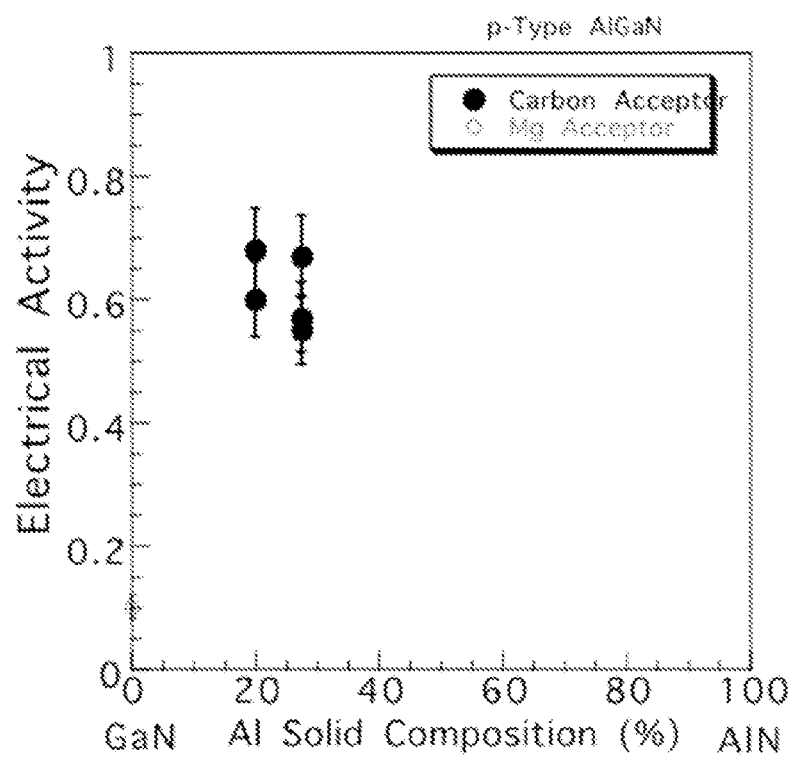
FIG. 8 shows the dependence of an electrical activity on Al solid composition for carbon and Mg acceptors in the p type AlGaN.

The inventor evaluated the electrical activity of carbon acceptors using few other samples. FIG. 8 is a graph which shows the dependence of electrical activity of carbon acceptors on Al solid composition. The electrical activity was evaluated to be around 55~71% using a carbon atom concentration (measured by using a SIMS analysis) and NIAD (measured by using a C-V measurement).

Three experimental results related to the electrical activity of carbon acceptors in AlGaN (Al=27%) are indicated as an error bar. According the results of the experiments by the inventor, the electrical activity of carbon acceptors in AlGaN (Al=27%) was in a range of 55~71%. As shown in FIG. 8, the electrical activity of carbon acceptors with 20% of Al solid composition was slightly larger or nearly equal to the electrical activity of AlGaN with 27% of Al solid composition. This is an indication of existence of a shallow carbon acceptor level in an AlGaN layer.

The NIAD in a doped with magnesium (Mg-doped p type GaN layer) was measured for the sample used for obtaining results shown in FIGS. 7 (a) and (b). The NIAD of Mg acceptors was $4\sim5\times10^{18}$ cm$^{-3}$ and the concentration of Mg in Mg-doped p type GaN was measured to be $5\times10^{19}$ cm$^{-3}$ using a SIMS analysis. Therefore, the electrical activity of the Mg acceptors in GaN was estimated to be about 8~10%. The electrical conductivity of the Mg acceptors was calculated from the three samples and are also indicated as an error bar at 0% of Al solid composition shown in FIG. 8. According to the results of the experiment by the inventor, the electrical activity of the carbon acceptors in AlGaN with 20~27% Al composition is larger than the electrical activity of the Mg acceptors in GaN.

In order to make further studies on the origin of p type conductivity, the electrical activity of acceptors ($N_A^-/N_A$) is calculated as a function of absolute temperature related to different activation energy levels $E_A$.

$$(N_A^-/N_A)=\exp\{-E_A/2kT\}$$

where k and T are the Boltzmann's constant and the absolute temperature respectively.

Figure 9:
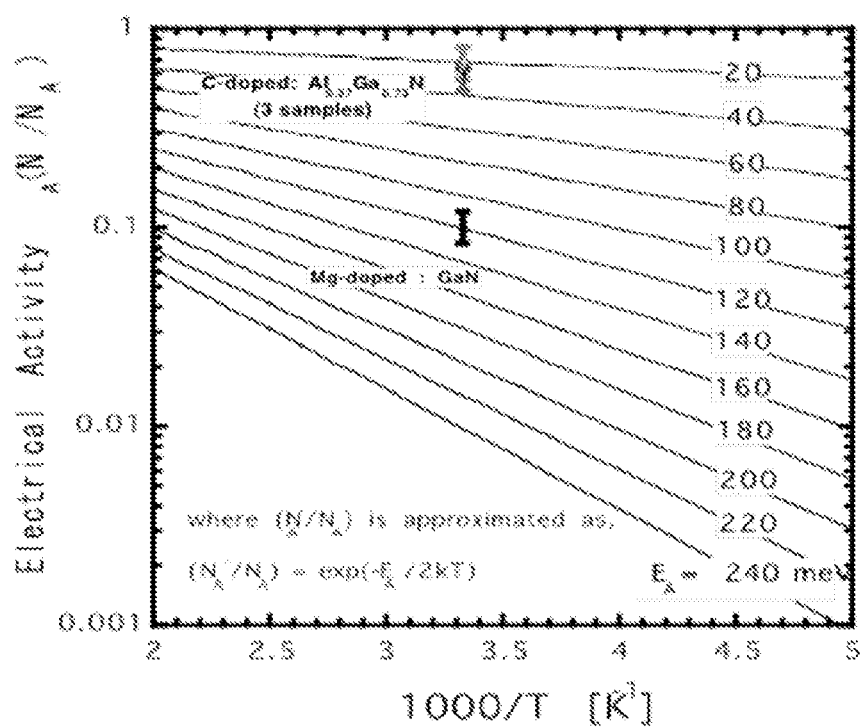
FIG. 9 shows experimentally evaluated activation energy of C acceptors in Al0.27Ga0.73N and Mg acceptors in GaN using the experimental electrical activity of carbon and magnesium acceptors at room temperature.

FIG. 9 is a graph which shows the activation energy of carbon acceptors in Al$_{0.27}$Ga$_{0.73}$N and Mg acceptors in GaN estimated using the experimental electrical activity of carbon and magnesium acceptors at room temperature. In FIG. 9, the electrical activity calculated for the activation energy from $E_A$=20 meV to 240 meV are shown by solid lines.

In this way, the inventor evaluates the activation energy of carbon acceptors in AlGaN with 27% of Al solid composition to be in a range of 22~30 meV and the activation energy of Mg acceptors in GaN to be in a range of 110~130 meV. The estimated activation energy of carbon acceptors is close to the carbon acceptor level in AlGaN with 27% of Al solid composition, which is measured from the PL emission spectrum.

Table 1 and table 2 summarize the electrical characteristics of the p type AlGaN semiconductor layer which was grown on the (0001) plane of the sapphire substrate using the LP-MOVPE method described above under same conditions as the epitaxial growth conditions described above. As can be seen from the tables, even in the case where the content of aluminum is increased, the electrical conductivity of AlGaN is maintained by doping the AlGaN semiconductor layer with carbon under the predetermined conditions disclosed by the present invention.

TABLE 1

| Embodiment | solid Al composition (%) | thick of layer (μm) | flow rate of CBr$_4$ (μmol/min) | contact resistance Rc (K Ω) | sheet resistance Rs (Ω/cm$^2$) |
|---|---|---|---|---|---|
| A | 10 | 5.5 | 2.6 | 2000~3500 | 2700000 |
| B | 10 | 2.3 | 5.1 | 1000~1800 | 930000 |
| C | 10 | 2.3 | 5.1 | 100~150 | 86000 |
| D | 25 | 0.4 | 1 | 150~200 | (4.0~4.5) E+03 |
| E | 77 | 0.4 | 13 | 95~120 | (5.0~7.3) E+03 |

TABLE 2

| Embodiment | resistivity (Ω · cm) | carrier mobility μ (cm2/V · s) | sheet carrier density Ps (cm$^{-2}$) | carrier density P (cm$^{-3}$) |
|---|---|---|---|---|
| A | 1500 | 0.14 | 1.6E+13 | 2.9E+16 |
| B | 210 | 0.19 | 3.5E+13 | 1.5E+17 |
| C | 20 | 0.097 | 7.5E+14 | 3.3E+18 |
| D | 0.1~0.19 | 12~16 | +(1.0~1.2) E+14 | +(2.6~2.9) E+18 |
| E | 2.2~2.9 | 0.30~0.36 | +(2.0~3.7) E+14 | +(6.0~9.3) E+18 |

In this way, according to the present invention, carbon is stably doped, and therefore it is possible to provide a method of manufacturing a p type nitride semiconductor layer doped with carbon with improved productivity. Furthermore, according to the manufacturing method of the present invention, a p type nitride semiconductor layer which has an improved content of aluminum can be provided. Therefore, the p type nitride semiconductor layer formed by the manufacturing method of the present invention has high pressure-resistant characteristics and excellent electrical properties, optical characteristics that the layer is transparent for up to light of a deep ultraviolet spectral region and high electrical conductivity.

Therefore, according to the present invention, it is possible to realize p type layer with low resistivity even in a power device in which a large current flows, and therefore it is possible to realize a nitride electrical power control device with higher performance.

EXPLANATION OF THE REFERENCE SYMBOLS 1 single crystal substrate
2 p type AlGaN semiconductor layer

What is claimed is:

1. A method of manufacturing a p type nitride semiconductor layer, comprising:
supplying a III-group material gas for a predetermined time period $T_1$;
supplying a V-group material gas containing a carbon source for a predetermined time period $T_2$ when a predetermined time period $t_1$ ($t_1+T_2>T_1$) elapses after the supply of the III-group material gas begins;
repeating the step of supplying the III-group material gas and the step of supplying the V-group material gas when a predetermined time period $t_2$ ($t_1+T_2-t_2>T_1$) elapses after the supply of the V-group material gas begins; and
thus forming an $Al_xGa_{1-x}N$ semiconductor layer ($0<x\leq1$) at a growth temperature of 1190° C.~1370° C. or a growth temperature at which a substrate temperature is 1070° C.~1250° C. using a chemical vapor deposition method or a vacuum evaporation method;
wherein
nitrogen sites are doped with carbon within the semiconductor layer.

2. The method of manufacturing the p type nitride semiconductor layer according to claim 1, wherein a single crystal substrate is a sapphire substrate having a main surface having an offset angle in a range of +/−0.1% with respect to a (0001) C-plane.

3. The method of manufacturing the p type nitride semiconductor layer according to claim 1, wherein the carbon source is carbon tetrabromide.

4. The method of manufacturing a p type nitride semiconductor layer according to claim 1, wherein the V-group material contains a magnesium source.

5. The method of manufacturing the p type nitride semiconductor layer according to claim 1, wherein a content of aluminum is 5 mol %~100 mol %.

6. The method of manufacturing the p type nitride semiconductor layer according to claim 1, wherein no overlap time period is set between the time period $T_1$ for supplying the III-group material gas and the time period $T_2$ for supplying the V-group material gas, and an interval time period between the time period $T_1$ for supplying the III-group material gas and the time period $T_2$ for supplying the V-group material gas is set to 0 seconds or more and 2 seconds or less.

* * * * *